(12) United States Patent
Ok et al.

(10) Patent No.: US 11,980,111 B2
(45) Date of Patent: May 7, 2024

(54) CONFINED BRIDGE CELL PHASE CHANGE MEMORY

(71) Applicant: INTERNATIONAL BUSINESS MACHINES CORPORATION, Armonk, NY (US)

(72) Inventors: Injo Ok, Loudonville, NY (US); Andrew Herbert Simon, Fishkill, NY (US); Kevin W. Brew, Niskayuna, NY (US); Muthumanickam Sankarapandian, Niskayuna, NY (US); Steven Michael McDermott, Wynantskill, NY (US); Nicole Saulnier, Slingerlands, NY (US)

(73) Assignee: International Business Machines Corporation, Armonk, NY (US)

(*) Notice: Subject to any disclaimer, the term of this patent is extended or adjusted under 35 U.S.C. 154(b) by 241 days.

(21) Appl. No.: 17/447,073

(22) Filed: Sep. 8, 2021

(65) Prior Publication Data

US 2023/0075622 A1  Mar. 9, 2023

(51) Int. Cl.
*H10N 70/00* (2023.01)
*H10N 70/20* (2023.01)

(52) U.S. Cl.
CPC ......... *H10N 70/823* (2023.02); *H10N 70/041* (2023.02); *H10N 70/231* (2023.02); *H10N 70/841* (2023.02)

(58) Field of Classification Search
CPC .................................................. H10N 70/823
See application file for complete search history.

(56) References Cited

U.S. PATENT DOCUMENTS

| | | | |
|---|---|---|---|
| 7,202,493 B2 | 4/2007 | Lung | |
| 7,321,130 B2 | 1/2008 | Lung | |
| 7,495,946 B2 | 2/2009 | Gruening-Von Schwerin | |
| 7,579,613 B2 | 8/2009 | Lung | |
| 7,750,335 B2 | 7/2010 | Clevenger | |
| 7,923,712 B2 | 4/2011 | Arnold | |
| 8,237,140 B2 | 8/2012 | Lung | |
| 8,471,236 B2 | 6/2013 | Breitwisch | |
| 8,476,612 B2 | 7/2013 | Peters | |
| 9,570,169 B1 | 2/2017 | Czornomaz | |
| 11,245,071 B2* | 2/2022 | Lin | H10B 61/00 |
| 2015/0243884 A1* | 8/2015 | BrightSky | H10N 70/826 257/4 |
| 2019/0140171 A1* | 5/2019 | BrightSky | H10N 70/231 |

OTHER PUBLICATIONS

Koelmans et al., "Projected phase-change memory devices", nature Communications, Published Sep. 3, 2015, pp. 1-7.

* cited by examiner

*Primary Examiner* — Mounir S Amer
(74) *Attorney, Agent, or Firm* — Samuel A. Waldbaum

(57) ABSTRACT

A phase change memory bridge cell comprising a dielectric layer located on top of a at least one electrode, wherein a trench is located in the dielectric layer. A first liner located at the bottom of the trench in the dielectric layer and the first liner is located on the sidewalls of the dielectric layer that forms the sidewalls of the trench. A phase change memory material located on top of the first liner, wherein a top surface of the phase change memory material is aligned with a top surface of the dielectric layer, wherein the dielectric layer is located adjacent to and surrounding the vertical sidewalls of the phase change memory material, wherein a top surface of the phase change memory material is flush with a top surface of the dielectric layer.

15 Claims, 16 Drawing Sheets

CONFINED BRIDGE CELL PHASE CHANGE MEMORY

BACKGROUND

The present invention generally relates to the field of phase change memory cells, and more particularly to a confined to a confined bridge cell phase change memory cell.

Utilizing phase change memory for analog computing requires memory cells with resistance that changes linearly with programming pulses and is predictable and repeatable. Amorphous phase change materials often suffer from "resistance drift," whereby the resistance of the cell changes over time, which makes the resistance of the cell unpredictable. To mitigate resistance drift, a projection segment, a parallel resistor that bypasses current around the amorphous volume, is added to the cell.

BRIEF SUMMARY

Additional aspects and/or advantages will be set forth in part in the description which follows and, in part, will be apparent from the description, or may be learned by practice of the invention.

A phase change memory bridge cell comprising a dielectric layer located on top of a at least one electrode, wherein a trench is located in the dielectric layer. A first liner located at the bottom of the trench in the dielectric layer and the first liner is located on the sidewalls of the dielectric layer that forms the sidewalls of the trench. A phase change memory material located on top of the first liner, wherein a top surface of the phase change memory material is aligned with a top surface of the dielectric layer, wherein the dielectric layer is located adjacent to and surrounding the vertical sidewalls of the phase change memory material, wherein a top surface of the phase change memory material is flush with a top surface of the dielectric layer.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 1:
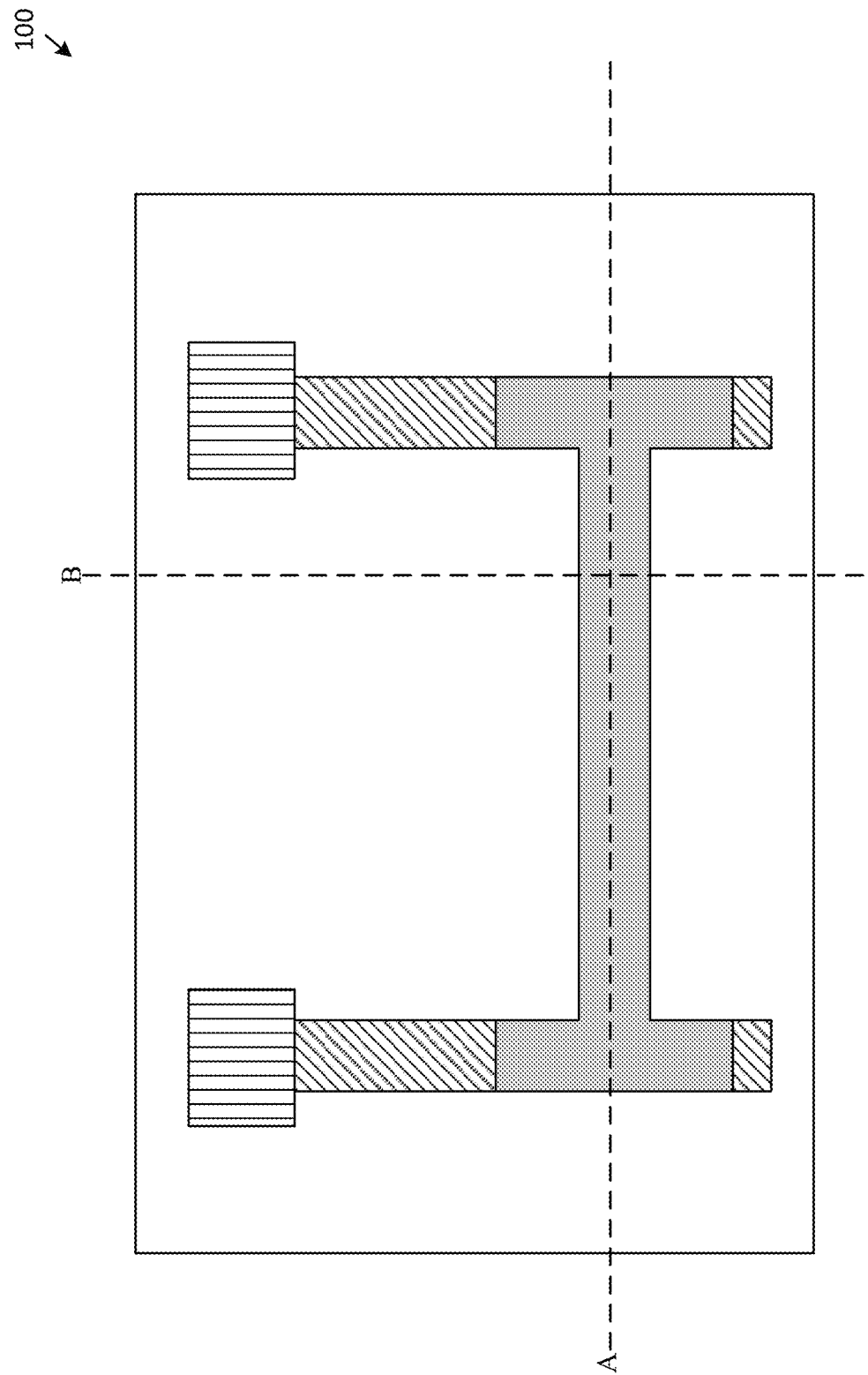
FIG. 1 illustrates a top-down view of a phase change memory bridge cell, in accordance with an embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various process used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (ME), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, wherein like reference numerals refer to like elements throughout. Phase change memory bridge cells are typically formed using a subtractive etching process, where the etching process causes damage to a side surface and/or to a top surface of the phase change material that forms the bridge cell. Typical subtractive etching process are reactive ion etching (RIE) or a WET etching process that removes the phase change material. The operational performance of the bridge cell is affected by the damaged surfaces caused by the etching process.

The damage can be avoided by forming the phase change memory bridge cell without using a subtractive etching process. The subtractive etching process can be replaced with a planarization process to remove the excess material, such as, a chemical mechanical planarization (CMP) process. The CMP process is not used to form the structure/shape of the bridge cell but is utilized to remove the excess phase change material. This is accomplished by etching a dielectric layer to layout a shape for the bridge cell. The dielectric layer acts as a frame for the formation of the bridge cell. This allows for the phase change material to be formed within the dielectric layer. When forming the phase change layer in the dielectric layer, excess material is formed on top of the dielectric layer. Using CMP to remove the excess phase change material does not damage the phase change material that comprises the top surface of the bridge cell. The side surfaces of the bridge cell are not damaged by the CMP process since the side surfaces are protected by the dielectric layer.

FIG. 1 illustrates a top-down view of a phase change memory bridge cell 100, in accordance with an embodiment of the present invention. FIG. 1 illustrates a top-down view of a phase change memory bridge cell 100 where cross-section A is across the horizontal center of the phase change memory (PCM) bridge cell 100. Cross-section B is across the bridge part of the PCM bridge cell 100.

Figure 2:
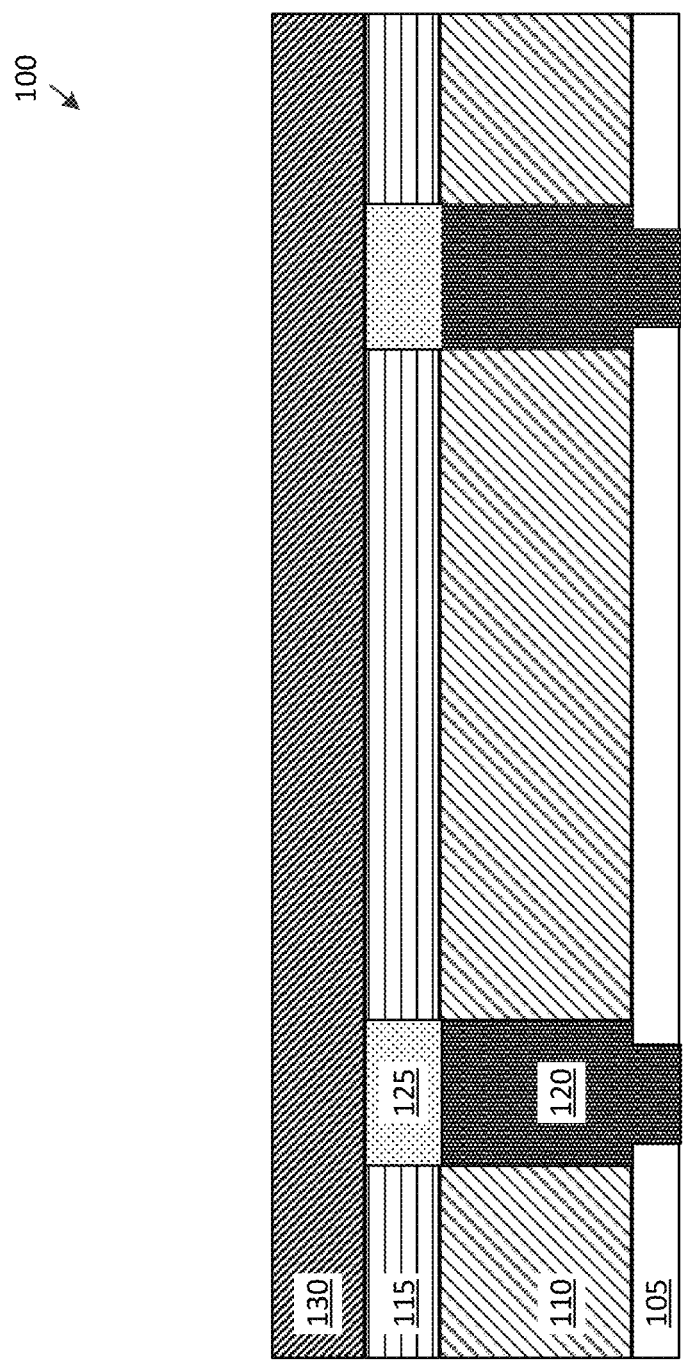
FIG. 2 illustrates cross section A of the bridge cell after formation of the initial layers, in accordance with the embodiment of the present invention.

FIG. 2 illustrates cross section A of the bridge cell after formation of the initial layers, in accordance with the embodiment of the present invention. The PCM bridge cell 100 includes a first metal layer 105, a first layer 110, a second layer 115, and a dielectric layer 130. At least one bottom electrode is located in the first metal layer 105, the first layer 110, and the second layer 115. The bottom electrode includes a first metal 120 and a second metal 125, where the first metal 120 and the second metal 125 are comprised of different conductive metals. The first layer 110 can be comprised of, for example, Tetraethyl orthosilicate (TEOS). The second layer 115 can be comprised of, for example, a dielectric material such as SiN. The dielectric layer 130 can be comprised of, for example, SiN or another dielectric material. The dielectric layer 130 is formed on top of the second layer 115 and on top of the second metal 125. The dielectric layer 130 and the second layer 115 can be comprised of the same dielectric material or different dielectric materials. The present invention illustrates that the second layer 115 and the dielectric layer 130 as different layers, but these layers can be a single layer instead.

Figure 3:
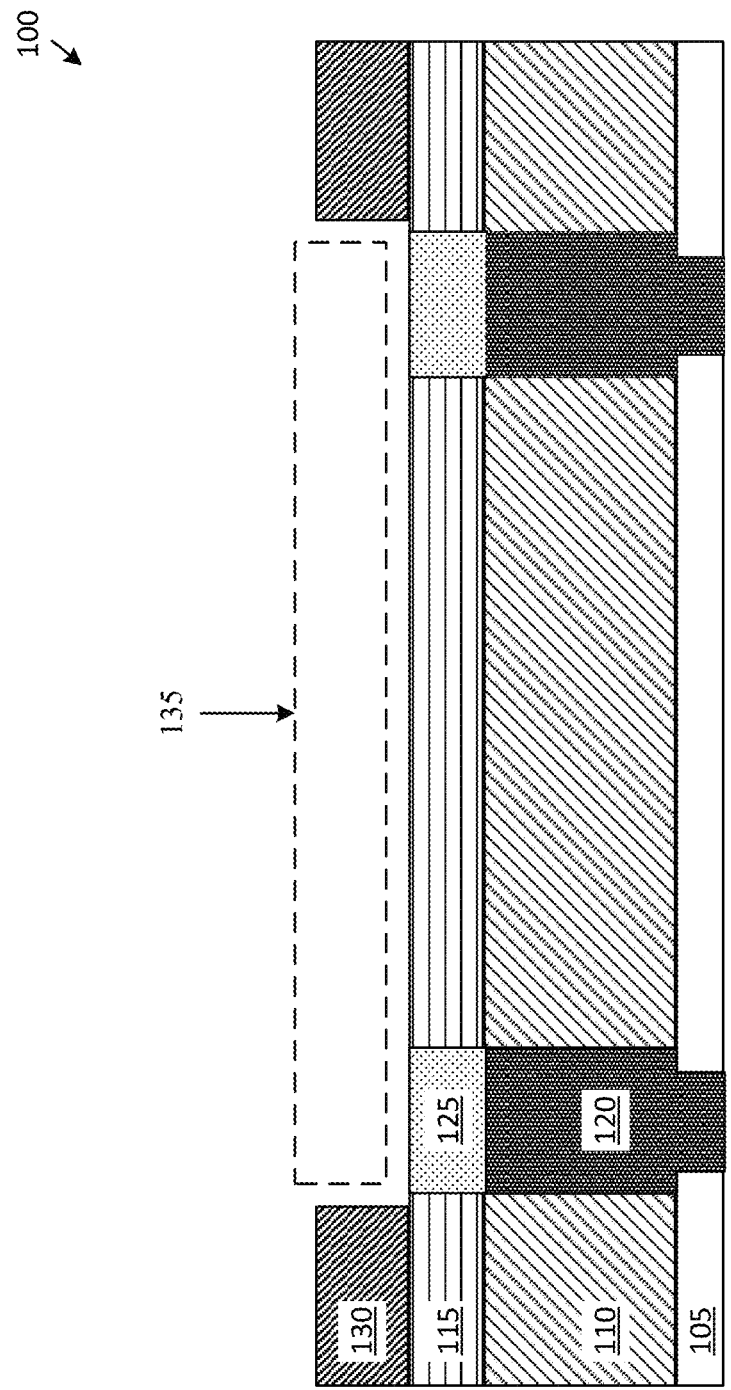
FIG. 3 illustrates cross section A of the bridge cell after formation of a trench, in accordance with the embodiment of the present invention.

FIG. 3 illustrates cross section A of the bridge cell after formation of a trench 135, in accordance with the embodiment of the present invention. The dielectric layer 130 is etched, for example, by reactive ion etching (RIE), to form a trench 135 in the shape of the desire bridge cell. The trench 135 exposes the top surface of the least one bottom electrode (FIG. 3 illustrates the trench 135 exposing the top surface of two bottom electrodes) and exposes the top surface of a portion of the second layer 115. The remaining dielectric layer 130 acts as walls of the trench 135. Furthermore, during the formation of the phase change memory layer 145 the remaining dielectric layer 130 acts as a frame for the formation of the bridge cell.

Figure 4:
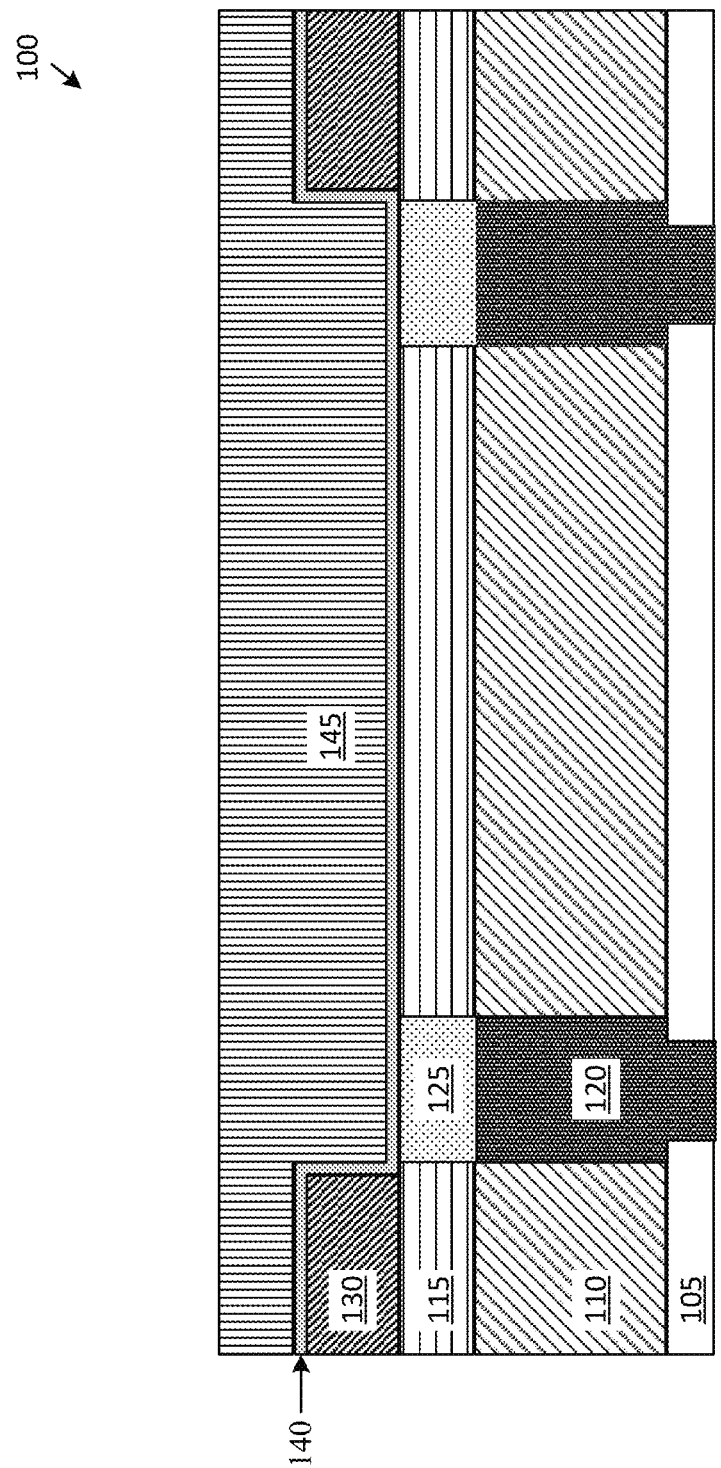
FIG. 4 illustrates cross section A of the bridge cell after formation of a liner and the phase change memory layer, in accordance with the embodiment of the present invention.

FIG. 4 illustrates cross section A of the bridge cell after formation of a liner 140 and the phase change memory layer 145, in accordance with the embodiment of the present invention. A liner 140 is formed on the top surface of the remaining dielectric layer 130, on top of the exposed second metal 125, and on top of the second layer 115. The liner 140 extends up the inner sidewalls of the remaining dielectric layer 130 that form the walls/frame of the trench 135. The liner 140 can be comprised of, for example, amorphous carbon, tantalum nitride (TaN), tungsten nitride (WN), cobalt tungsten (CoW), nickel tungsten (NiW), yttrium oxide (YO), or any other suitable materials. A phase change memory (PCM) layer 145 is formed on top of the liner 140. The PCM layer 145 can be composed essentially of a phase change material such as a germanium-antimony-tellurium (GST), gallium-antimony-tellurium (GaST), or silver-iridium-antimony-telluride (AIST) material, although other materials can be used as appropriate. Other PCM materials can be used, including but not limited to, germanium-tellurium compound material (GeTe), Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, Ge—Te alloys and combinations thereof. PCM material may be undoped or doped (e.g., doped with one or more of oxygen (O), nitrogen (N), silicon (Si), or titanium (Ti)). The terms "composed essentially" and "consist essentially," as used herein with respect to materials of different layers, indicates that other materials, if present, do not materially alter the basic characteristics of the recited materials. For example, a PCM material consisting essentially of GST material does not include other materials that materially alter the basic characteristics of the GST material. Excess liner 140 and excess PCM layer 145 extend above the top surface of the dielectric layer 130.

Figure 5:
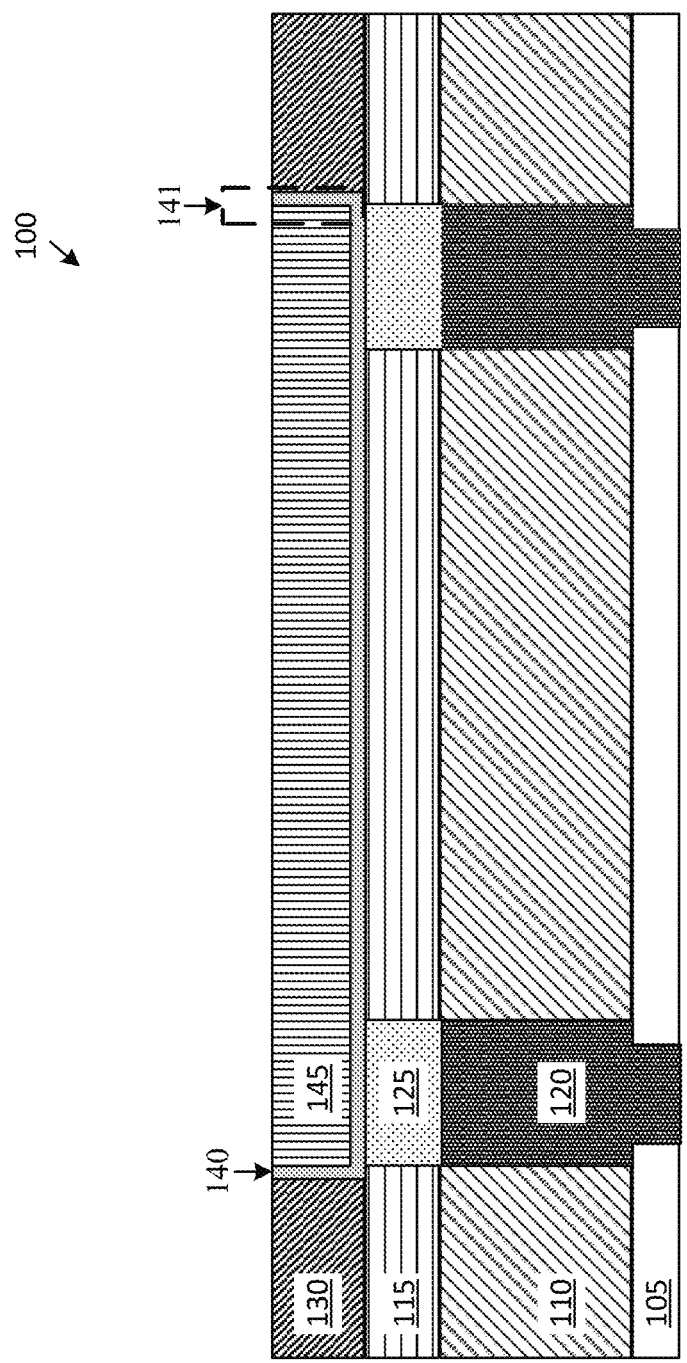
FIG. 5 illustrates cross section A of the bridge cell after planarization, in accordance with the embodiment of the present invention.

FIG. 5 illustrates cross section A of the bridge cell 100 after planarization, in accordance with the embodiment of the present invention. Chemical-mechanical planarization (CMP) is used to remove excess liner 140 and excess PCM layer 145 to create a uniform surface across the top of the dielectric layer 130, the liner 140, and the PCM layer 145. The liner 140 is located directly beneath the PCM layer 145, and the liner 140 has at least one vertical section 141 that is located between the PCM layer 145 and the dielectric layer 130.

Figure 6A:
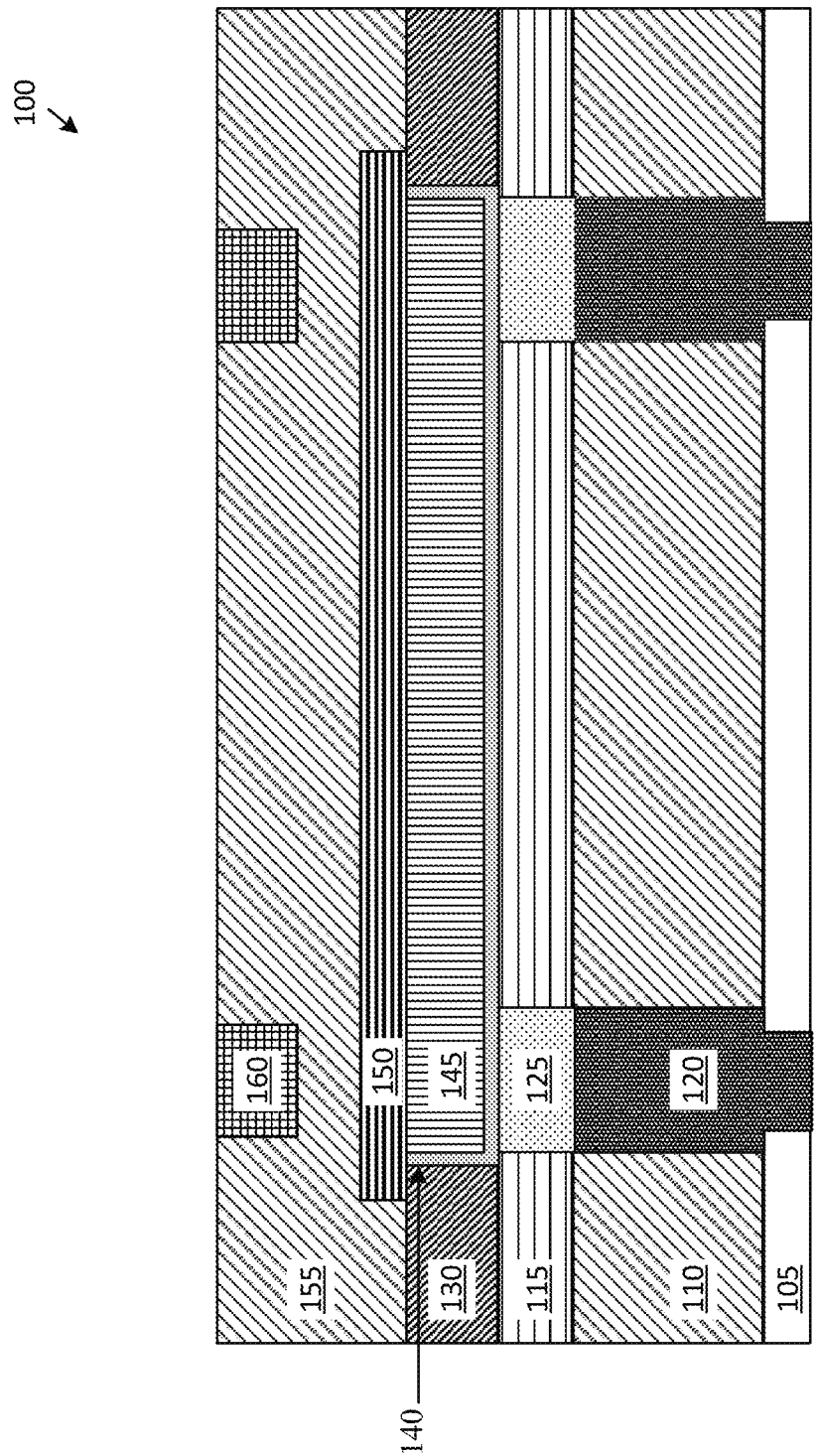
FIG. 6A illustrates cross section A of the bridge cell after formation of additional layers, in accordance with the embodiment of the present invention.
Figure 6B:
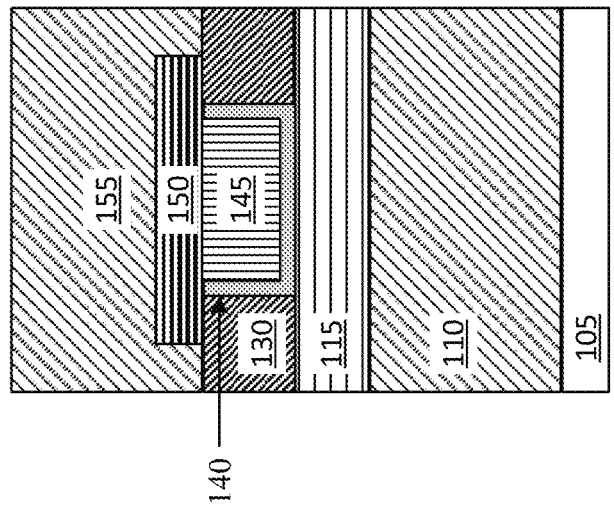
FIG. 6B illustrates cross section B of the bridge cell after formation of additional layers, in accordance with the embodiment of the present invention.

FIG. 6A illustrates cross section A of the bridge cell after formation of additional layers, in accordance with the embodiment of the present invention. FIG. 6B illustrates cross section B of the bridge cell after formation of additional layers, in accordance with the embodiment of the present invention. Cap 150 is formed on top of the exposed liner 140, the PCM layer 145, and on top of a portion of the dielectric layer 130. The cap 150 can be comprised of, for example, SiN. A third layer 155 is formed on top of the remaining dielectric layer 130 and on top of the cap 150. The third layer 155 can be comprised of, for example, Tetraethyl orthosilicate (TEOS). The third layer 155 encloses the cap 150. An upper electrical contact 160 is formed in the third layer 155.

Figure 7A:
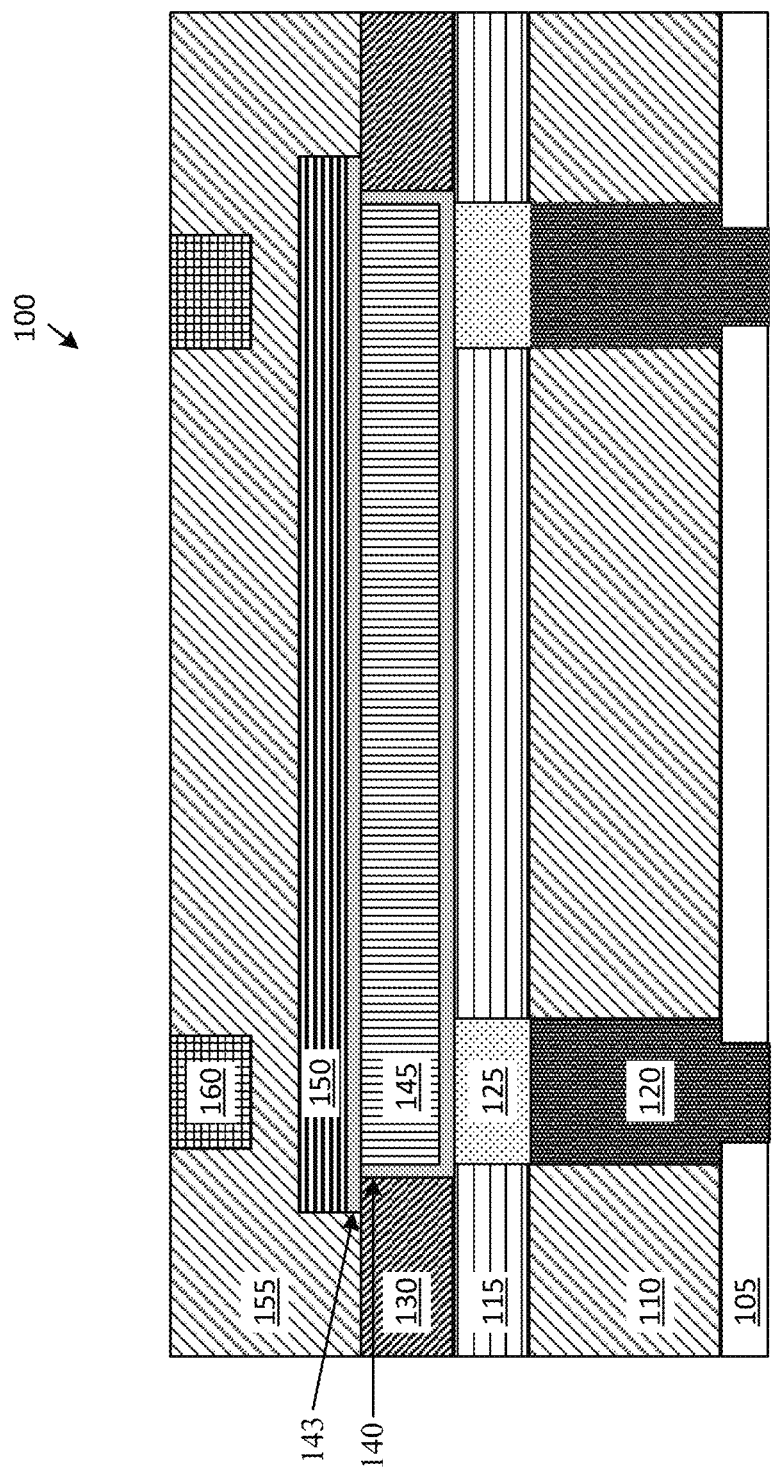
FIG. 7A illustrates cross section A of the bridge cell after formation of additional layers, in accordance with the embodiment of the present invention.
Figure 7B:
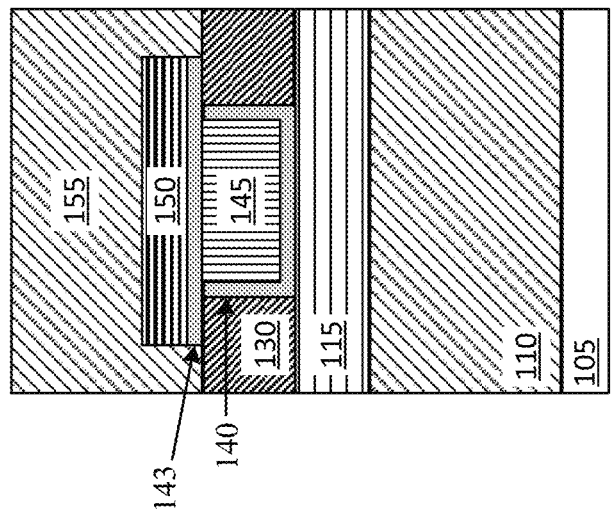
FIG. 7B illustrates cross section B of the bridge cell after formation of additional layers, in accordance with the embodiment of the present invention.

FIG. 7A illustrates cross section A of the bridge cell after formation of additional layers, in accordance with the embodiment of the present invention. FIG. 7B illustrates cross section B of the bridge cell after formation of additional layers, in accordance with the embodiment of the present invention. The bridge cell illustrated in FIGS. 7A and 7B is similar to the bridge cell illustrated in FIGS. 6A and 6B. The difference is that an additional liner 143 is formed to enclose the PCM layer 145. The additional liner 143 is formed on top of the liner 140, the PCM layer 145, and on top of a portion of the remaining dielectric layer 130. The cap 150 is formed on top of the additional liner 143. Additionally, the third layer 155 is in contact with the sides of the additional liner 143. Therefore, the bridge cell illustrated by FIGS. 7A and 7B is completely encapsulated by the liner 140 and 143.

Figure 8:
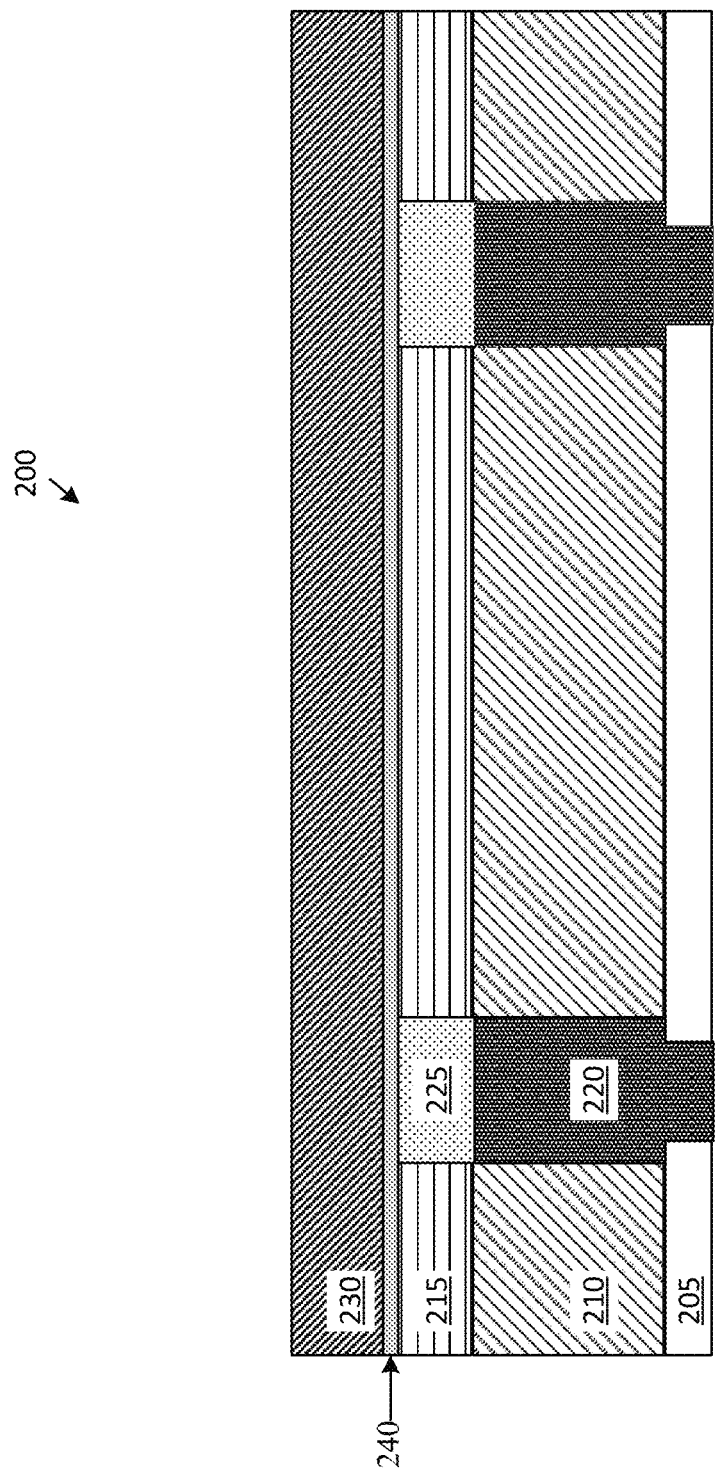
FIG. 8 illustrates cross section A of the bridge cell after formation of a liner and a dielectric layer on top of a base, in accordance with the embodiment of the present invention.

FIG. 8 illustrates cross section A of the bridge cell after formation of a liner and a dielectric layer on top of a base, in accordance with the embodiment of the present invention. The PCM bridge cell 200 includes a first metal layer 205, a first layer 210, a second layer 215, a dielectric layer 230, and a liner 240. At least one bottom electrode is located in the first metal layer 205, the first layer 210, and the second layer 215. The bottom electrode includes a first metal 220 and a second metal 225, where the first metal 220 and the second metal 225 are comprised of different conductive metals. The first layer 210 can be comprised of, for example, Tetraethyl orthosilicate (TEOS). The second layer 215 can be comprised of, for example, a dielectric material such as SiN. The liner 240 is formed on top of the second layer 215 and on top of the second metal 225. The liner 240 can be comprised of, for example, amorphous carbon, tantalum nitride (TaN), tungsten nitride (WN), cobalt tungsten (CoW), nickel tungsten (NiW), yttrium oxide (YO), or any other suitable materials. The dielectric layer 230 is formed on top of the liner 240. The dielectric layer 230 can be comprised of, for example, SiN or another dielectric material. The dielectric layer 230 and the second layer 215 can be comprised of the same dielectric material or different dielectric materials.

Figure 9:
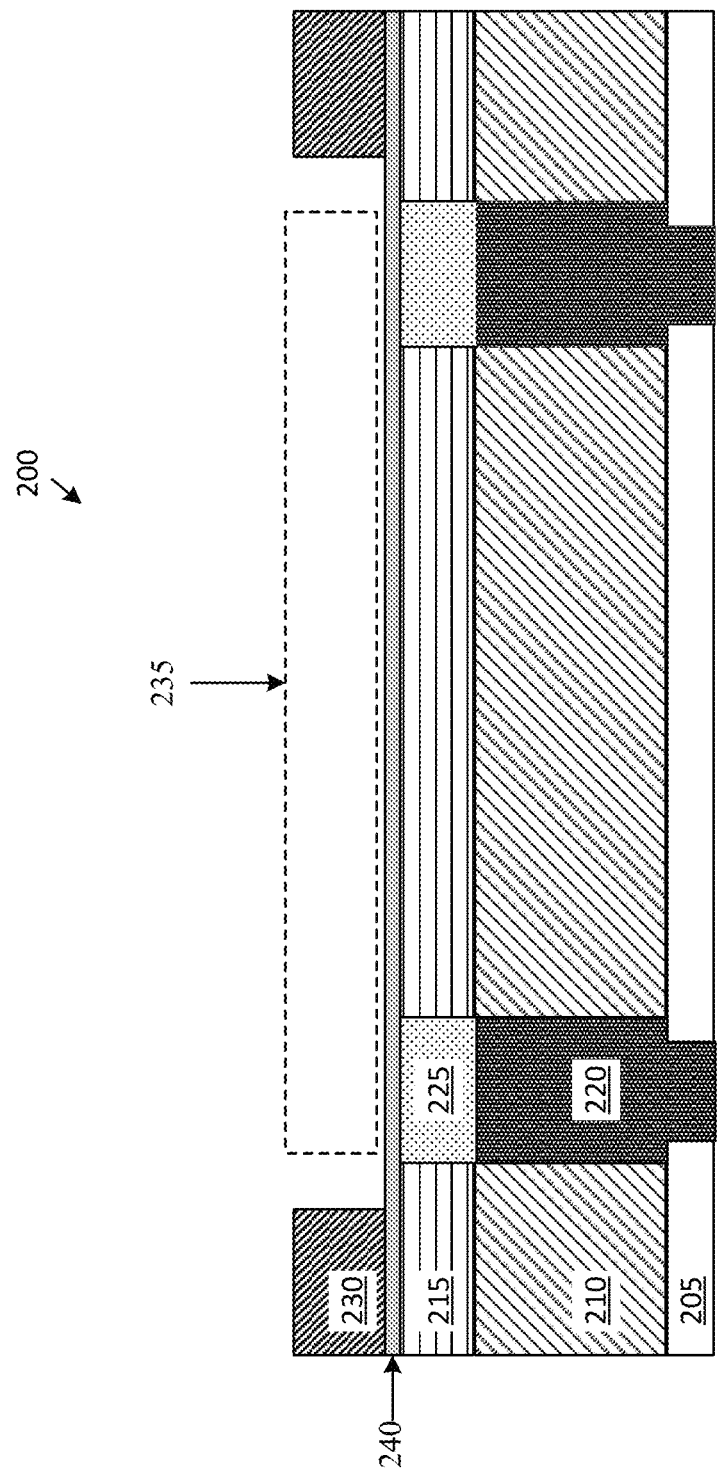
FIG. 9 illustrates cross section A of the bridge cell after formation of a trench, in accordance with the embodiment of the present invention.

FIG. 9 illustrates cross section A of the bridge cell after formation of a trench, in accordance with the embodiment of the present invention. The dielectric layer 230 is etched, for example, by reactive ion etching (RIE), to form a trench 235 in the shape of the desire bridge cell. The trench 235 exposes a top surface of the liner 240, where the trench is located above at least one of the bottom electrodes. The remaining dielectric layer 230 acts as walls of the trench 235. Furthermore, during the formation of the phase change memory layer 245 the remaining dielectric layer 230 acts as a frame for the formation of the bridge cell.

Figure 10:
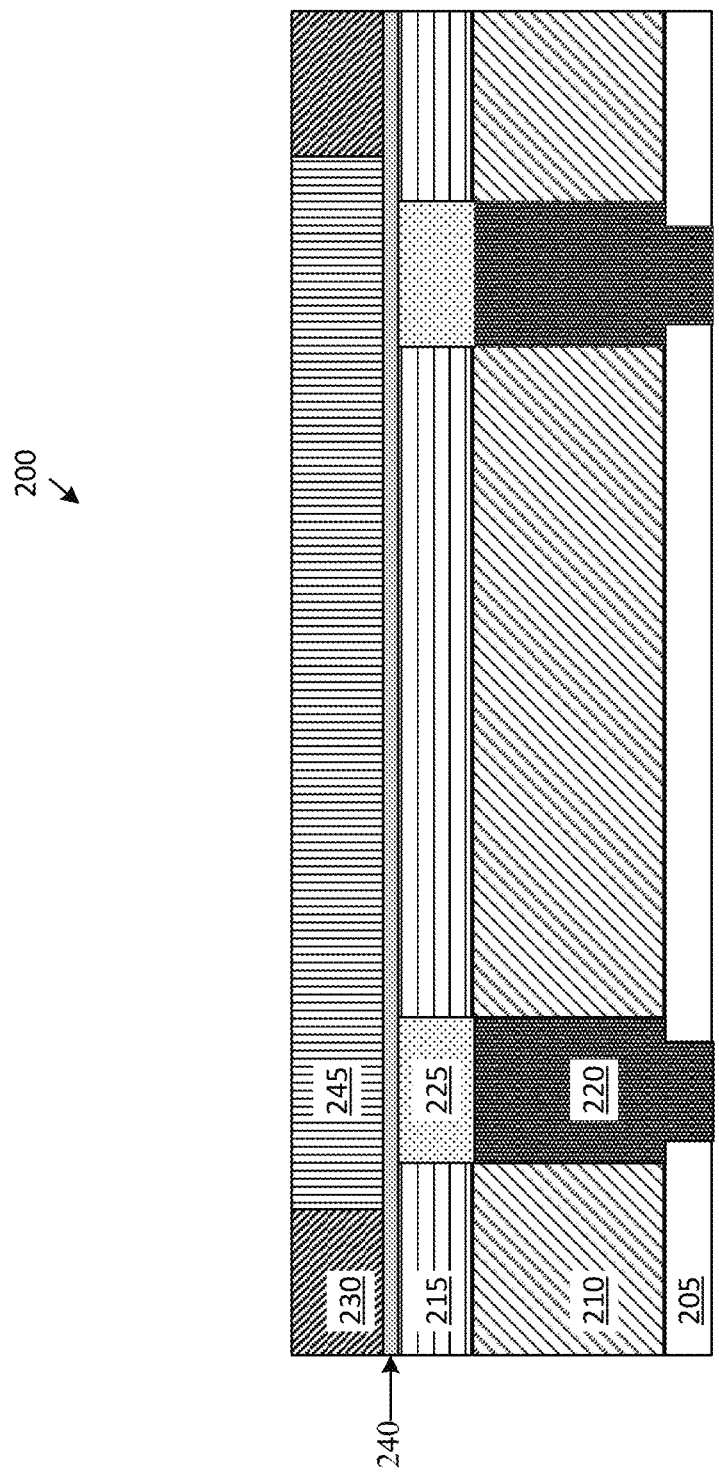
FIG. 10 illustrates cross section A of the bridge cell after formation of a phase change memory layer, in accordance with the embodiment of the present invention.

FIG. 10 illustrates cross section A of the bridge cell after formation of a phase change memory layer, in accordance with the embodiment of the present invention. A phase change memory (PCM) layer 245 is formed on top of the liner 240 within the trench 235 and on top of the dielectric layer 230. The PCM layer 245 can be composed essentially of a phase change material such as a germanium-antimony-tellurium (GST), gallium-antimony-tellurium (GaST), or silver-iridium-antimony-telluride (AIST) material, although other materials can be used as appropriate. Other PCM materials can be used, including but not limited to, germanium-tellurium compound material (GeTe), Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, Ge—Te alloys and combinations thereof. PCM material may be undoped or doped (e.g., doped with one or more of oxygen (O), nitrogen (N), silicon (Si), or titanium (Ti)). The terms "composed essentially" and "consist essentially," as used herein with respect to materials of different layers, indicates that other materials, if present, do not materially alter the basic characteristics of the recited materials. For example, a PCM material consisting essentially of GST material does not include other materials that materially alter the basic characteristics of the GST material. Excess PCM layer 245 that is formed on the dielectric layer 230 and that extends above the dielectric layer 230 is removed by a planarization process, for example, chemical-mechanical planarization (CMP). The planarization process creates a uniform surface across the top of the dielectric layer 230, and the PCM layer 245. The liner 240 extends beneath the PCM layer 245 and the remaining dielectric layer 230. A difference between the FIG. 10 and FIG. 5, is that liner 240 is located beneath PCM layer 245 is not located between the PCM layer 245 and the dielectric layer 230.

Figure 11:
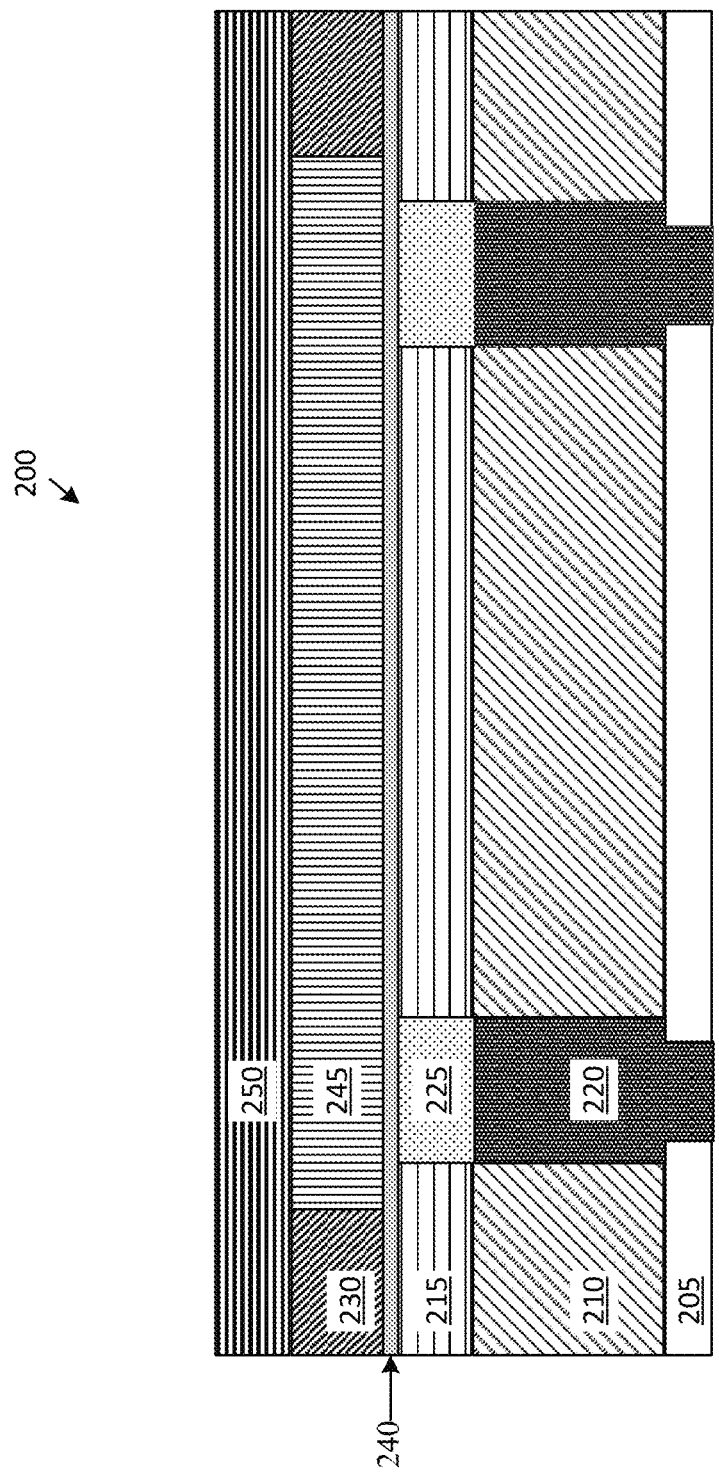
FIG. 11 illustrates cross section A of the bridge cell after formation of a cap, in accordance with the embodiment of the present invention.

FIG. 11 illustrates cross section A of the bridge cell after formation of a cap, in accordance with the embodiment of the present invention. Cap 250 is formed on top of the PCM layer 245 and on top of the remaining dielectric layer 230. The cap can be comprised of for example, SiN.

Figure 12:
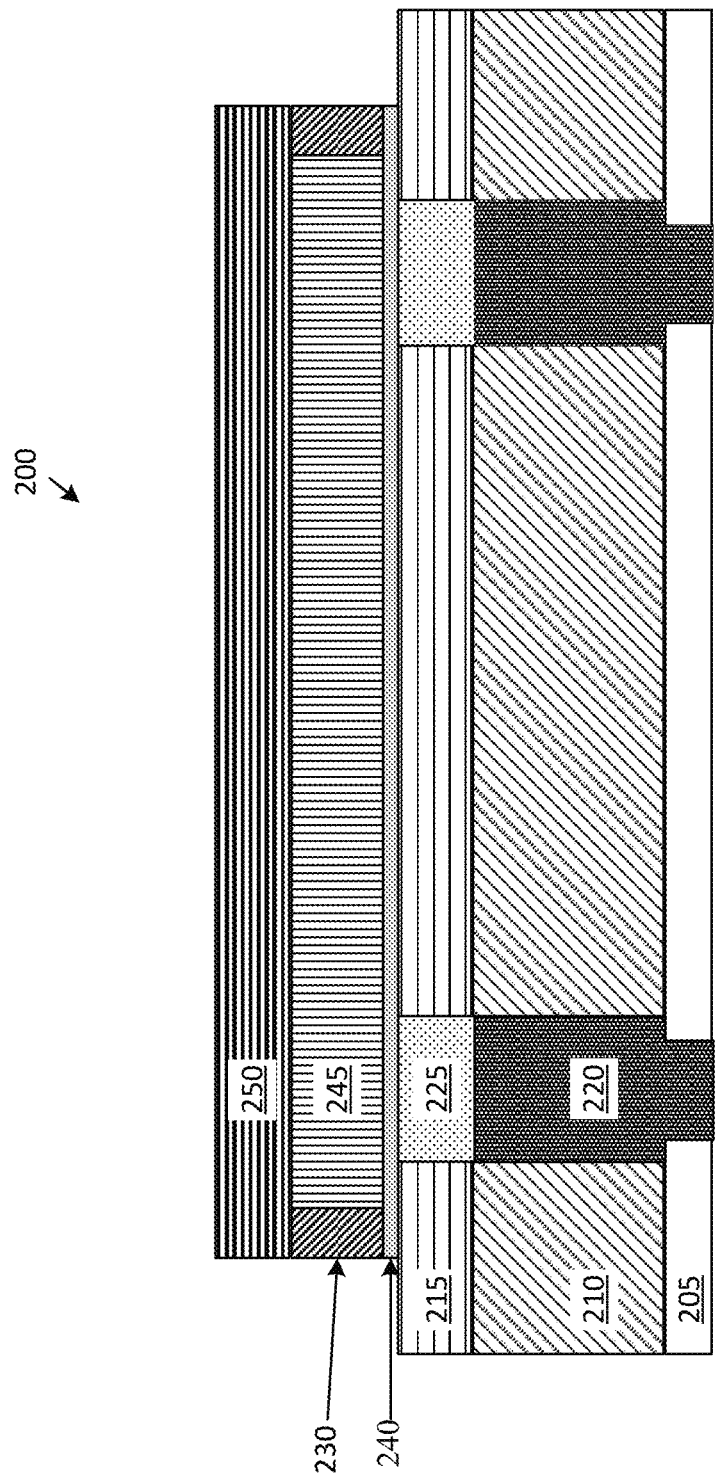
FIG. 12 illustrates cross section A of the bridge cell after an etching process, in accordance with the embodiment of the present invention.

FIG. 12 illustrates cross section A of the bridge cell after an etching process, in accordance with the embodiment of the present invention. A portion of the cap 250, the dielectric layer 230, and the liner 240 are etched to expose a portion of the second layer 215. The PCM layer 245 remains enclosed by the liner 240, the dielectric layer 230, and the cap 250.

Figure 13A:
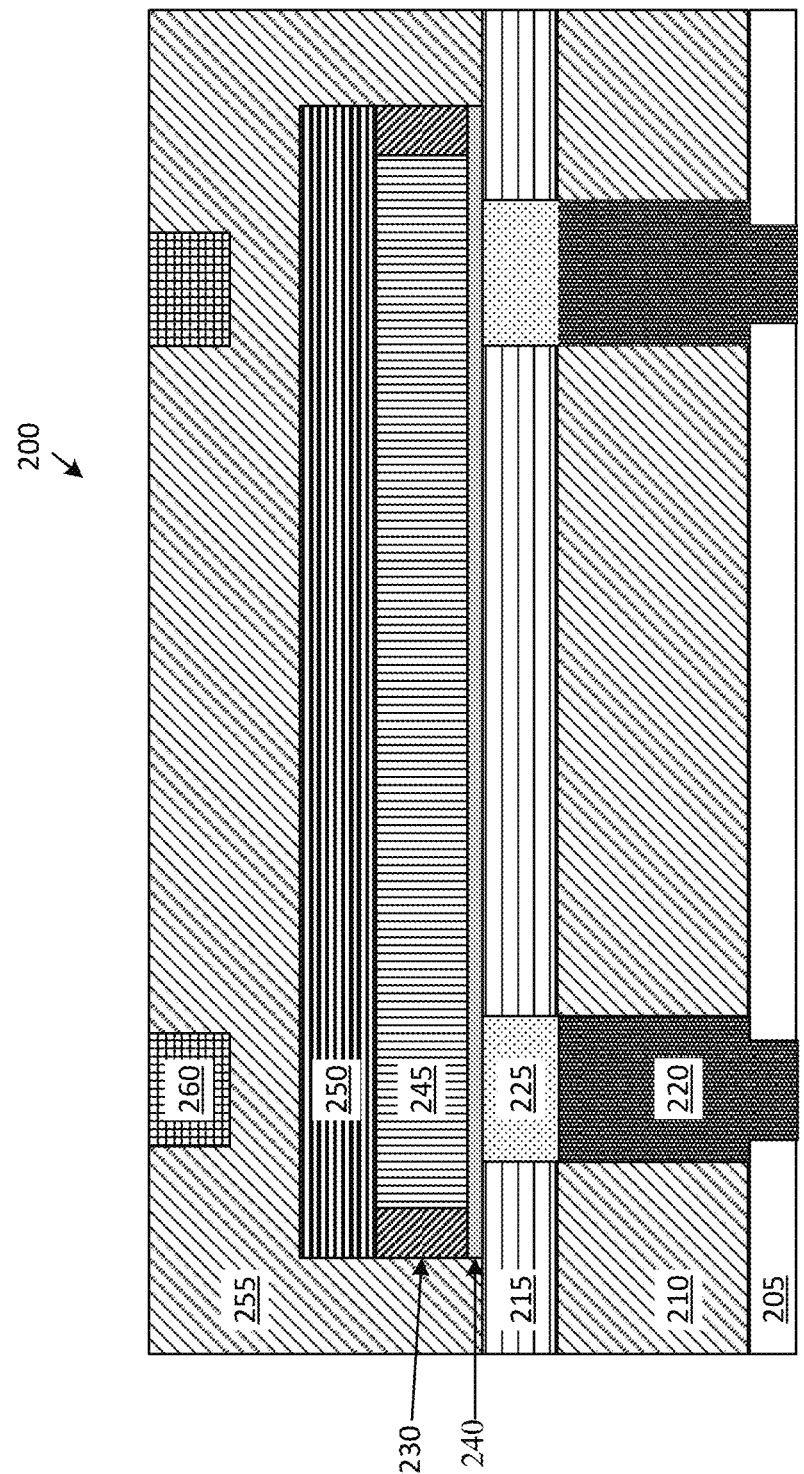
FIG. 13A illustrates cross section A of the bridge cell after formation of additional layers, in accordance with the embodiment of the present invention.
Figure 13B:
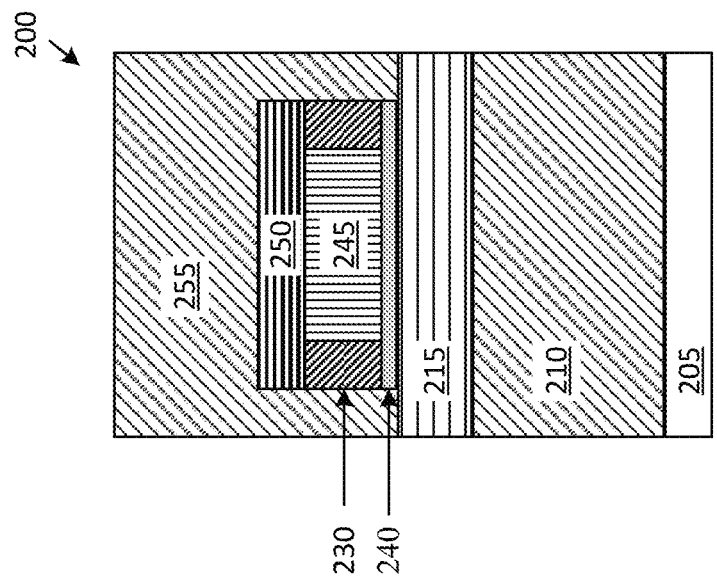
FIG. 13B illustrates cross section B of the bridge cell after formation of additional layers, in accordance with the embodiment of the present invention.

FIG. 13A illustrates cross section A of the bridge cell after formation of additional layers, in accordance with the embodiment of the present invention. FIG. 13B illustrates cross section B of the bridge cell after formation of additional layers, in accordance with the embodiment of the present invention. A third layer 255 is formed on top of the exposed second layer 215 and on top of the cap 250. The third layer 255 can be comprised of, for example, Tetraethyl orthosilicate (TEOS). The third layer 255 encloses the stack comprised of the cap 250, the liner 240, the dielectric layer 230, and the PCM layer 245. An upper electrical contact 260 is formed in the third layer 155.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A phase change memory bridge cell comprising:
a dielectric layer located on top of at least two electrodes, wherein a trench is located in the dielectric layer, wherein the at least two electrodes are located on the same level;
a first liner located at the bottom of the trench in the dielectric layer and the first liner is located on the sidewalls of the dielectric layer that forms the sidewalls of the trench, wherein a bottom surface of the first liner is in contact with each of the at least two electrodes; and a phase change memory material located on top of the first liner, wherein a top surface of the phase change memory material is aligned with a top surface of the dielectric layer, wherein the dielectric layer is located adjacent to and surrounding the vertical sidewalls of the phase change memory material, wherein a top surface of the phase change memory material is flush with a top surface of the dielectric layer.

2. The phase change memory bridge cell of claim 1, wherein the first liner is located on multiple sides of the phase change memory material.

3. The phase change memory bridge cell of claim 2, wherein the first liner is located directly beneath the phase change memory material.

4. The phase change memory bridge cell of claim 3, wherein the first liner extends up to the sides of the phase change memory material.

5. The phase change memory bridge cell of claim 4, wherein a top surface of the first liner is planar with the top surface of the phase change memory material.

6. The phase change memory bridge cell of claim 1, further comprising:
   a cap located on top of the phase change memory material.

7. The phase change memory bridge cell of claim 6, wherein the cap is further located on top of the first liner and the dielectric layer.

8. The phase change memory bridge cell of claim 1, further comprising:
   a second liner located on top of the phase change memory material.

9. The phase change memory bridge cell of claim 8, wherein the second liner is further located on top of the first liner and the dielectric layer.

10. The phase change memory bridge cell of claim 9, further comprising:
    a cap located on top of the second liner.

11. A phase change memory cell comprising:
    a liner located on top of a first layer;
    a phase change memory material located on top of the liner,
    a dielectric layer located on top of the liner and adjacent to and surrounding the phase change memory material, wherein a top surface of the phase change memory material is flush with a top surface of the dielectric layer, wherein the liner is located beneath the phase change memory material and beneath the dielectric layer; and
    at least two electrodes located on the same level in the first layer, wherein the that least one electrode is electrically connected to the phase change memory material, wherein a bottom surface of the liner is in contact with each of the at least two electrodes.

12. The phase change memory cell of claim 11, wherein the dielectric layer is in direct contact with a side surface of the phase change memory material.

13. The phase change memory cell of claim 12, wherein the liner is direct contact with a bottom surface of the phase change material layer and the liner is in direct contact with a bottom surface of the dielectric layer.

14. The phase change memory cell of claim 11, further comprising:
    a cap located on top of the dielectric layer and on top of the phase change memory material.

15. The phase change memory cell of claim 14, further comprising:
    a second layer that located on top of the first layer and located on top of the cap, wherein the second layer is adjacent to and surround the dielectric layer.

* * * * *